United States Patent [19]

Gurley

[11] Patent Number: 5,244,418
[45] Date of Patent: Sep. 14, 1993

[54] METHOD OF MAKING A PLUG-IN DIODE DEVICE AND DIODE DEVICE PRODUCED THEREBY

[75] Inventor: Arnold E. Gurley, Evanston, Ill.

[73] Assignee: Littelfuse, Inc., Des Plaines, Ill.

[21] Appl. No.: 936,109

[22] Filed: Aug. 25, 1992

[51] Int. Cl.$^5$ .................................. H01R 13/66
[52] U.S. Cl. ............................. 439/620; 337/260
[58] Field of Search ................ 439/620, 621, 622; 337/4, 5, 6, 255, 260

[56] References Cited

U.S. PATENT DOCUMENTS

| | | | |
|---|---|---|---|
| 3,962,782 | 7/1976 | Williamson | 29/623 |
| 4,997,393 | 3/1991 | Armando | 439/620 |
| 5,139,443 | 8/1992 | Armando | 439/621 |

*Primary Examiner*—Gary F. Paumen
*Attorney, Agent, or Firm*—Wallenstein, Wagner & Hattis, Ltd.

[57] ABSTRACT

A method of mass producing plug-in diode units includes the steps of punching areas of metal from a sheet metal body and forming the remaining areas of the body to leave longitudinally spaced, confronting pairs of laterally extending terminal blades having plug-in terminal end portions extending in different planes and opposite diode-mounting end portions in the same plane connected by webs or links to the rest of the sheet metal body. Diode elements are then soldered or welded between the diode-mounting end portions of each pair of terminal blades, and an insulating housing is molded around the diode-mounting end portions of each pair of terminal blades and the diode element secured thereto. The connecting links of each pair of terminal blades then are severed, leaving exposed severed portions of the connecting links which form accessible test points for testing the continuity of the diode element within each housing even after the terminal blades are plugged into a connector block.

6 Claims, 2 Drawing Sheets

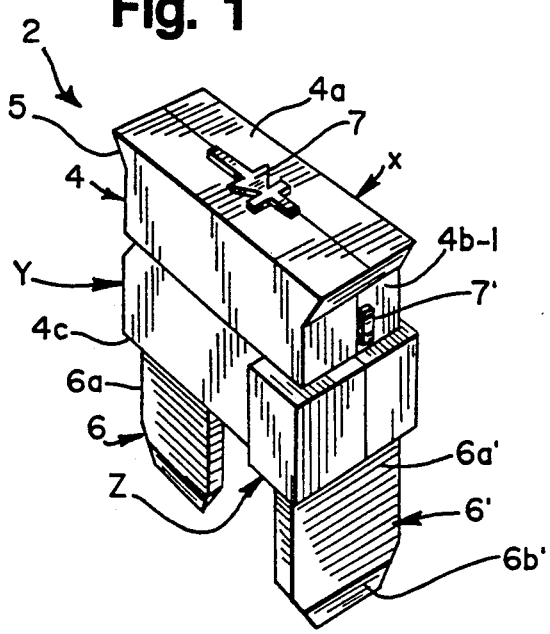
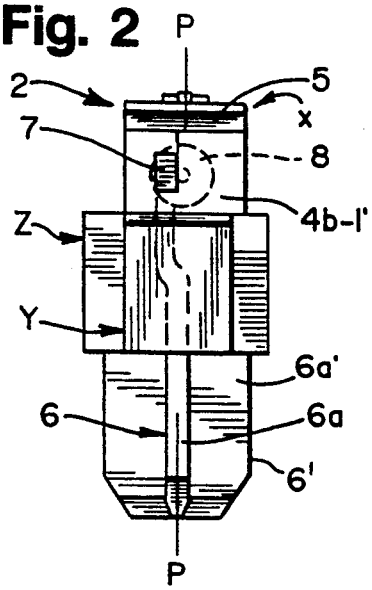
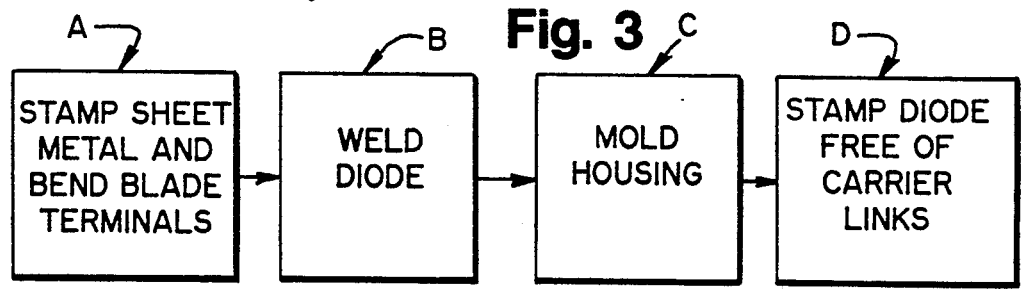
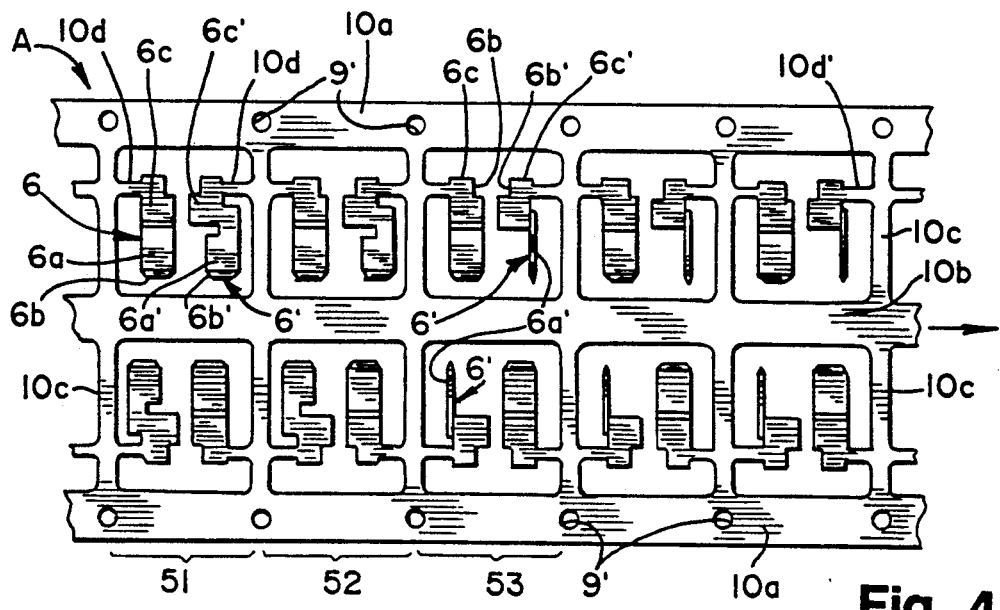

METHOD OF MAKING A PLUG-IN DIODE DEVICE AND DIODE DEVICE PRODUCED THEREBY

RELATED APPLICATION

The present invention is an improvement over the subject matter of U.S. Pat. No. 4,997,393, granted Mar. 5, 1991, entitled "Housing Assembly for Plug-In Electrical Element Having Blade-Type Terminals."

TECHNICAL FIELD OF INVENTION

The present invention relates to a plug-in diode particularly suited to automotive applications, such as disclosed in U.S. Pat. No. 4,997,393. Automotive plug-in diodes like that disclosed in this patent have terminal blades configured for insertion into correspondingly configured connector block socket terminals and are, therefore, easily replaced in the event of diode failure. Such plug-in diodes have polarized terminal blades achieved by orienting one of the terminal blades at right angles to the other, to provide for only a one-way insertion of the diode into the connector block terminals.

The plug-in diode disclosed in U.S. Pat. No. 4,997,393 includes a pair of diode test terminals exposed at the top of an insulating housing thereof. The housing is an open-bottom, pre-molded unit which, in the method of assembly of the diode, is slipped over the extensions of the terminal blades in a manner analogous to that disclosed in U.S. Pat. No. 3,962,782, which shows a similar method for assembling an automotive fuse.

In the method disclosed in the latter patent, a continuous strip of fuse metal is fed through a series of metal punching and forming dies which provide longitudinally interconnected fuse blanks containing pairs of laterally spaced, coplanar terminal blades oriented longitudinally of the strip and fuse links connected between extensions of the terminal blades. The terminal blades are connected to the strip by webs extending between the terminals. A pre-molded, open-ended housing is applied over and secured to the terminal blade extensions of the last blank of the strip, and the resulting fuse is separated from the strip by severing the connecting webs at their points of connection to the strip. The pre-molded housing has apertures in the outer face thereof through which the terminal blade extensions are accessible for providing test points for the fuse.

While such a method is a satisfactory way to make a plug-in diode where diode elements are soldered or welded across the terminal blade extensions before the pre-formed housing is applied thereover, this is a more costly method than that ideally desired. The object of the present invention is to provide a lower cost method of making plug-in diodes which have a pair of exposed diode test terminals.

One such less costly method has been used prior to the present invention. As in the method described above, it begins with a strip of metal for forming the terminal blades of a plurality of plug-in diode units. The strip is progressively punched and formed to leave confronting pairs of terminal blades connected to the rest of the strip by connecting links or webs which are to be subsequently severed from the strip. Before these connecting links or webs are severed, a housing is molded around extensions of the confronting pairs of terminal blades punched from the strip. Diode elements are soldered to the terminal extensions before the housing is molded thereover. When the terminal blade-connecting links are subsequently severed from the rest of the strip, the severance points leave exposed portions of the terminal blades which can act as diode test points. However, when the plug-in diode units are inserted into a connector block, these exposed portions of the terminal blades are covered by the plug-in connector block and so are not accessible without removing the entire plug-in diode from the connector block.

SUMMARY OF INVENTION

One aspect of the present invention provides a similar method for making plug-in diodes as just described, except that the connecting webs or links which interconnect the terminal blades to the rest of the strip are positioned so that they are located at the outer sides of the terminal blade extensions, to provide test points accessible after the plug-in diode has been plugged into a connector block. These and other features of the invention will become apparent upon making reference to the specification, drawings and claims.

DESCRIPTION OF DRAWINGS

FIG. 1 is a perspective view of the plug-in diode made in accordance with the method aspects of the present invention;

FIG. 2 is an end elevational view of the plug-in diode shown in FIG. 1, as seen from the left side of FIG. 1;

FIG. 3 is a block diagram showing the different basic steps utilized in carrying out the method aspects of the present invention;

FIG. 4 illustrates the first steps of the method illustrated by the first block in FIG. 3;

DESCRIPTION OF EXEMPLARY FORM OF THE INVENTION

Figure 5:
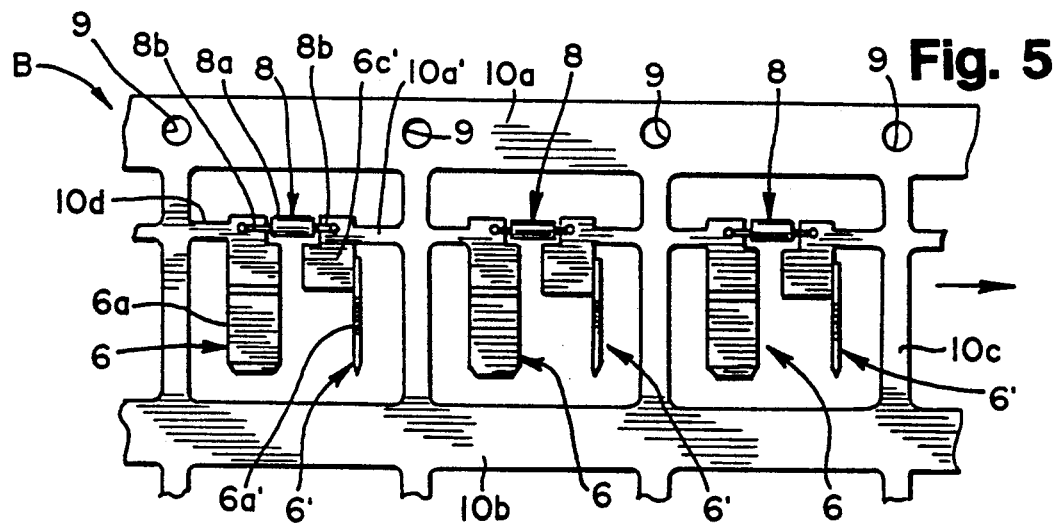
FIG. 5 illustrates the second step indicated by the second block in FIG. 3.

Referring now to FIGS. 1 and 2, the plug-in diode made by the method of the present invention is identified by reference numeral 2. It includes a molded housing 4, from the bottom surface of which projects terminal blades 6-6'. The terminal blade 6 has a plug-in portion 6a extending generally in a central, vertical longitudinal plane P—P (see FIG. 2). The terminal blade 6' has a plug-in portion 6a' extending in a plane transverse to the plane P—P in which the other terminal blade 6 extends. The bottom ends 6b-6b' of the plug-in portions 6a'—6a' of the terminal blade 6-6' have tapered profiles.

Figure 6:
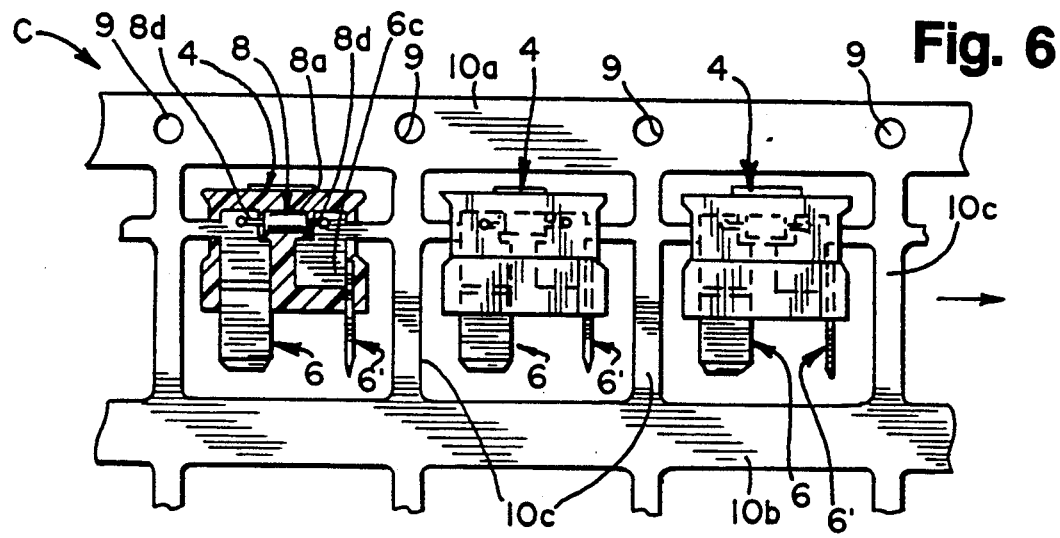
FIG. 6 illustrates the step indicated by the third block in FIG. 3.

The plug-in portion 6a of the terminal blade 6 merges with a diode-mounting portion 6c offset to one side of the centered plug-in portion 6a, as shown in FIG. 2. As best shown in FIG. 6, the plug-in portion 6a' of the terminal blade 6 merges with a terminal blade 6' which has a diode mounting portion 6c' at right angles to the plug-in portion 6a' thereof and in the same plane as the diode-mounting portion 6c of the other terminal blade 6. Also shown in FIG. 6 is a diode element 8 encapsulated within the housing 4 which is molded around the diode element 8, the uppermost ends of plug-in portions 6a-6a' of terminal blades 6-6' and the diode-mounting portions 6c-6c' thereof. The diode 8 includes a cylindrical body 8a from which extends longitudinal leads 8b—8b which are respectively soldered or otherwise physically and electrically connected to the inner faces of the diode-mounting portions 6c-6c' of the terminal blades 6-6'. The diode body 8a is centered with respect to the longitudinal center plane P—P of the plug-in diode 2.

The outwardly facing portions of the diode-mounting portions of each terminal blade pair 6-6' are exposed at 7-7' at the side faces of the molded housing 4, so that the plug-in diode has exposed test points when the plug-in diode is plugged into the socket of a connector block.

In the interest of saving molding material, the molded housing 4 has a top section X within which the encapsulated diode 8 is centered, a bottom section Y in which the upper ends of the plug-in portion 6a of the terminal blade 6 is centered and a bottom section Z in which the upper extremity of the plug-in terminal portion 6a' of the terminal blade 6' is centered. The exposed test points 7-7' of the diode-mounting portions of the terminal blades 6-6' are located in apertures in the side walls 4b-1 and 4b-1' of the upper section X of the molded housing 4, as shown in FIGS. 1-2. The outer surfaces of these side walls merge with the top surface 4a of the upper section X of the molded housing through upwardly and outwardly inclining finger-gripping surfaces 5—5, to aid in removing the diode 2 from a connector into which it is plugged. The bottom housing sections Y and Z have bottom surfaces extending in a common horizontal plane.

FIG. 3 illustrates the method steps respectively shown in FIGS. 4-7. Reference characters A, B, C and D are used to identify the four blocks shown in FIG. 3. These corresponding letters are found in the upper left hand corner of FIGS. 4-7 respectively, which illustrate the steps identified in these blocks. As shown in FIG. 4, a strip 10 of sheet metal is fed sequentially through a series of dies (not shown) which progressively punch out areas of metal in the sheet metal strip, to leave transversely extending, confronting pairs of terminal blades 6-6' shown in the two left hand sections S1-S2 of the strip.

As shown in FIG. 4, the mutually offset portions 6a and 6c of the blades 6 are shown already formed in the first sections S1 and S2 of the strip. All portions of the other blades 6' are shown in the plane of the strip 10 in these strip sections S1 and S2. These pairs of blades are shown aligned in upper and lower horizontal rows of the strip 10.

In the next section S3 of the strip, the plug-in portions 6a' of the terminal blades 6' are shown bent at right angles to the plane of the strip 10. The diode-mounting portions 6a' of the terminal blades 6' remain in the plane of the strip 10.

The diode-mounting portions 6c-6c' of the confronting pairs of terminal blades 6-6' are shown in FIG. 4 connected to the rest of the strip 10 by longitudinally extending connecting links or webs 10d-10d', respectively. These links connect with laterally extending legs 10c of the strip extending between longitudinally extending outer marginal portions 10a—10a and an intermediate longitudinally extending portion 10b of the strip 10. The outer marginal portions 10a—10a of the strip 10 have positioning holes 9 for receiving pins projecting from a suitable conveyor which conveys the strip 10 sequentially to the various metal punching and forming dies of the equipment used to form the sheet metal strip 10. Recesses 6b-6b' (see strip section S3) are formed in the confronting edges of the diode-mounting portions 6c-6c' of the terminal blades 6-6'. These recesses form clearance spaces for the bodies 8a of the diode elements 8.

Next, the sheet metal strip 10 is fed to a diode-feeding and soldering or welding station which solders or welds the diode terminal leads 8b—8b to the diode-mounting portions 6c—6c of the terminal blade pairs 6-6'. This is illustrated in FIG. 5.

The diode-forming portions 6c-6c' of each pair of confronting terminal blades 6-6' are spaced from the inwardly facing margins of the adjacent outer longitudinal marginal portion 10a of the strip 10 and the inwardly facing margins of the lateral legs 10c of the strip 16. These leave spaces for the insertion of housing molding elements (not shown) which are moved into place to injection mold the housing 4 out of a suitable insulating synthetic plastic material. FIG. 6 illustrates the result of this molding operation. A raised indicia 7 (FIG. 1) is shown molded into the top surface 4a of each housing 4. This indicia shows diagrammatically a diode element with an arrow pointing in the direction of positive current flow. This arrow is used as a reference to check the conduction and orientation of the diode element 8.

Figure 7:
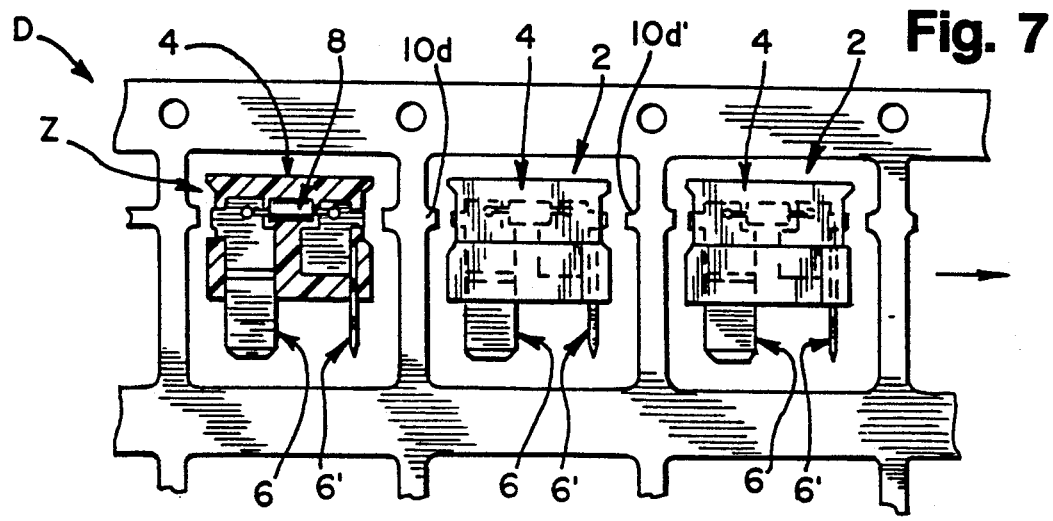
FIG. 7 illustrates the step indicated by the fourth block in FIG. 3.

FIG. 7 illustrates the last step in the production of the plug-in diode 2, which is to sever the connecting links 10d-10d', which connect the diode-mounting portions 6c-6c' of the terminal blade pairs 6-6', to the strip 10. This severance occurs at the innermost margins of the connecting links 10d-10d', which leaves the exposed test points 7-7' previously described.

It is apparent that the present method provides a very low cost and efficient method of making a plug-in diode which has exposed test points at the upper extremities of the molded housing, so that these test points are available for testing the continuity and polarity of the diode elements 8c after the plug-in diodes 2 are plugged into sockets of a connector block.

While the invention has been described with reference to a preferred embodiment, it will be understood by those skilled in the art that various changes may be made and equivalents may be substituted for elements thereof without departing from the broader aspects of the invention. Also, it is intended that broad claims not specifying details of a particular embodiment disclosed herein as the best mode contemplated for carrying out the invention should not be limited to such details. Furthermore, while, generally, specific claimed details of the invention constitute important specific aspects of the invention in appropriate instances even the specific claims involved should be construed in light of the doctrine of equivalents.

I claim:

1. A plug-in diode unit comprising: a housing made of insulating material and having top, bottom, front, rear and side surfaces; a first conductive terminal-forming, blade secured in said housing, said first blade having a diode-mounting end portion enclosed by said housing and a plug-in terminal end portion projecting from said bottom surface of said housing in a first plane; said diode-mounting end portion of said blade having at its outer side margin a portion exposed to the exterior of said housing through one of said side surfaces to form a first diode continuity test point; a second conductive polarizing terminal-forming blade secured in said housing, said second blade having a diode-mounting end portion enclosed by said housing and a plug-in terminal end portion projecting from said bottom surface of said housing in spaced confronting relationship to said plug-in terminal portion of said first blade, said plug-in terminal end portion of said second blade being in a plane transverse to said first plane, said diode-mounting end portion of said second blade having at its outer side margin a portion exposed to the exterior of said housing through the other side surface to form a second diode continuity test point; and a diode element having a body portion located in the space between said diode-mounting end portions of said first and second terminal-forming blades, the terminal leads of said diode element being physically and electrically connected to said diode-mounting end portions of said first and second blades; and said housing being molded around all portions of said diode element and diode-mounting end portions of said blades, except for said test point-forming portions thereof.

2. The plug-in diode unit of claim 1 wherein said first plane is located substantially mid-way between the adjacent front and rear surfaces of said housing, said diode-mounting end portions of said terminal-forming blades being located generally in a third plane parallel to and offset from said first plane so that said diode unit body is located generally centrally within said molded housing and said leads are physically connected to the adjacent side of said offset diode-mounting end portions of the terminal blades.

3. The plug-in diode unit of claim 2 where said diode-mounting end portions of said terminal blades have recesses in the confronting edges thereof to provide space for the body portion of said diode element.

4. The plug-in diode unit of claim 1 wherein said housing is molded so that said diode element is centered in a first section of said molded housing.

5. The plug-in diode unit of claim 4 wherein said housing is molded so that said plug-in terminal end portion of the polarizing terminal blade is centered in a second section of the molded housing projecting laterally of the margins of said first section.

6. The plug-in diode unit of claim 5 wherein said housing is molded so that said diode element is centered in a first section of said molded housing, the plug-in terminal end portion of the other terminal blade is centered in a third section of the housing.

* * * * *